United States Patent
Ikeda et al.

(10) Patent No.: US 10,757,071 B2
(45) Date of Patent: Aug. 25, 2020

(54) BRIDGE DEVICE AND FACILITY NETWORK

(71) Applicant: MITSUBISHI ELECTRIC CORPORATION, Tokyo (JP)

(72) Inventors: Yusuke Ikeda, Tokyo (JP); Katsuyoshi Takahashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/341,395

(22) PCT Filed: Dec. 6, 2016

(86) PCT No.: PCT/JP2016/086139
§ 371 (c)(1),
(2) Date: Apr. 11, 2019

(87) PCT Pub. No.: WO2018/105029
PCT Pub. Date: Jun. 14, 2018

(65) Prior Publication Data
US 2020/0045013 A1    Feb. 6, 2020

(51) Int. Cl.
*H04J 3/08* (2006.01)
*H04L 29/12* (2006.01)
(Continued)

(52) U.S. Cl.
CPC .... *H04L 61/2069* (2013.01); *H04L 12/40032* (2013.01); *H04L 12/66* (2013.01)

(58) Field of Classification Search
CPC combination set(s) only.
See application file for complete search history.

(56) References Cited

U.S. PATENT DOCUMENTS 6,675,251 B1 * 1/2004 Streitenberger .... G06F 13/4059
710/306
7,197,039 B2 * 3/2007 Shizume ............. H04L 12/4625
370/395.31
(Continued)

FOREIGN PATENT DOCUMENTS

JP    4-81042 A    3/1992

OTHER PUBLICATIONS

IEEE Std 802.1j, Supplement to Information technology—Telecommunications and information exchange between systems—Local area networks—Media access control (MAC) bridges: Managed objects for MAC bridges, IEEE, 56 pages, Jun. 9, 1997.*

(Continued)

*Primary Examiner* — Frank Duong
(74) *Attorney, Agent, or Firm* — Birch, Stewart, Kolasch & Birch, LLP

(57) ABSTRACT

A bridge device (120-1) which can effectively reduce the waste of the band resource in the upstream bus connected to a management device is realized by including: a first input/output port (221); a second input/output port (222); a group information keeping unit (228) to keep a group identifier and a correspondence between one or more terminal devices and the group identifier, the group identifier identifying a group that includes one or more terminal devices to be connected to the second input/output port (222), the one or more terminal devices belonging to the group; an extended-request processing unit (224) to generate, when an extended-request frame including destination information corresponding to the group identifier for requesting state information of the one or more terminal devices belonging to the group is inputted to the first input/output port (221), a request frame to be outputted from the second input/output port (222) to each of the one or more terminal devices belonging to the group, on the basis of the extended-request frame; and a (Continued)

relay processing unit (223) to output the request frame to the second input/output port (222) and output the extended-request frame to the extended-request processing unit (224).

14 Claims, 14 Drawing Sheets

(51) Int. Cl.
*H04L 12/40* (2006.01)
*H04L 12/66* (2006.01)

(56) References Cited

U.S. PATENT DOCUMENTS

| | | | |
|---|---|---|---|
| 8,971,323 B2 * | 3/2015 | Mithyantha | H04L 45/16 370/390 |
| 9,736,054 B2 * | 8/2017 | Bacthu | H04L 12/4633 |
| 2002/0091888 A1 * | 7/2002 | Streitenberger | H04L 12/4625 710/305 |
| 2003/0123461 A1 * | 7/2003 | Riley | H04L 12/46 370/401 |

OTHER PUBLICATIONS

International Search Report for PCT/JP2016/086139 (PCT/ISA/210) dated Feb. 28, 2017.

\* cited by examiner

| Terminal | Connection port |
|---|---|
| Management device 110 | Input/output port 221 |
| Terminal device 130-1 | Input/output port 222 |
| Terminal device 130-2 | Input/output port 222 |
| Terminal device 130-3 | Input/output port 221 |
| Terminal device 130-4 | Input/output port 221 |

(b)

| Terminal | Connection port |
|---|---|
| Management device 110 | Input/output port 221 |
| Terminal device 130-1 | Input/output port 221 |
| Terminal device 130-2 | Input/output port 221 |
| Terminal device 130-3 | Input/output port 222 |
| Terminal device 130-4 | Input/output port 222 |

Fig. 5

| Representative terminal device | Terminal devices belonging to group |
|---|---|
| Terminal device 130-1 | Terminal devices 130-1, 130-2, and 130-3 |
| Terminal device 130-3 | Terminal devices 130-3, 130-4, and 130-1 |

Fig. 11

| Group number | Terminal devices belonging to group |
|---|---|
| Group 1 | Terminal devices 130-1, 130-2, and 130-3 |
| Group 2 | Terminal devices 130-3, 130-4, and 130-1 |

BRIDGE DEVICE AND FACILITY NETWORK

TECHNICAL FIELD

The present invention relates to a bridge device and a facility network extended by connection via plural bridge devices.

BACKGROUND ART

A conventional facility network uses a transmission medium of a shared-bus architecture (hereinafter, referred to as a bus) which is generally a narrow band media; and, in order to extend the network, a bridge device is used to connect two physically distinct buses. Such a bridge device has a filtering function not to casually waste bus bands. For example, a bridge device (relay device) described in Patent Document 1 has two transmission/reception means and a storage means that stores the information on terminal devices connected to each of the two transmission/reception means. When a packet is transmitted to a terminal device, the bridge device works so as for the packet to be transmitted only via the transmission/reception means to which the terminal device is connected on the basis of the terminal information stored in the storage means.

PRIOR ART DOCUMENTS

Patent Document

Patent Document 1: Japanese Unexamined Patent Application Publication No. H4-81042 (FIG. 1)

SUMMARY OF THE INVENTION

Problem to be Solved by the Invention

However, in a case where a facility network is extended using the above-mentioned conventional bridge devices in a way that plural bridge devices are connected to a single bus (upstream bus) to which a management device managing information of terminal devices is connected, and each of the plural bridge devices is connected to a downstream bus to which terminal device are connected, this configuration enables the reduction of the waste of the band resources in the bridge devices' downstream buses, while it does not achieve the reduction of the waste of the band resource in the upstream bus, or causes wider band occupation.

The present invention is devised to solve the above-mentioned problem and to provide a bridge device for the reduction of the waste of the band source in the upstream bus connected to the management device in the shared-bus architecture network.

Solution to Problems

To solve the above-mentioned problem to achieve the purpose, the bridge device according to the present invention includes: a first input/output port; a second input/output port; a group information keeping unit to keep a group identifier and a correspondence between one or more terminal devices and the group identifier, the group identifier identifying a group that includes one or more terminal devices to be connected to the second input/output port, the one or more terminal devices belonging to the group; an extended-request processing unit to generate, when an extended-request frame including destination information corresponding to the group identifier for requesting state information of the one or more terminal devices belonging to the group is inputted to the first input/output port, a request frame to be outputted from the second input/output port to each of the one or more terminal devices belonging to the group, on the basis of the extended-request frame; and a relay processing unit to output the request frame to the second input/output port and output the extended-request frame to the extended-request processing unit.

Effect of the Invention

The bridge device according to the present invention has the above-mentioned configuration, therefore the bridge device realizes the reduction of the waste of the band resource in the upstream bus connected to the management device.

BRIEF DESCRIPTION OF THE DRAWINGS

FIG. 4 show examples of a filtering database according to Embodiment 1 of the present invention.

FIG. 11 is a data structure diagram showing an example of group information according to Embodiment 2 of the present invention.

Hereinafter, embodiments of a bridge device according to the present invention will be explained in detail on the basis of figures. In the figures referred to hereinafter, the same symbols are given to the same or equivalent elements. Note that these embodiments do not limit the scope of the present invention.

Embodiment 1

Figure 1:
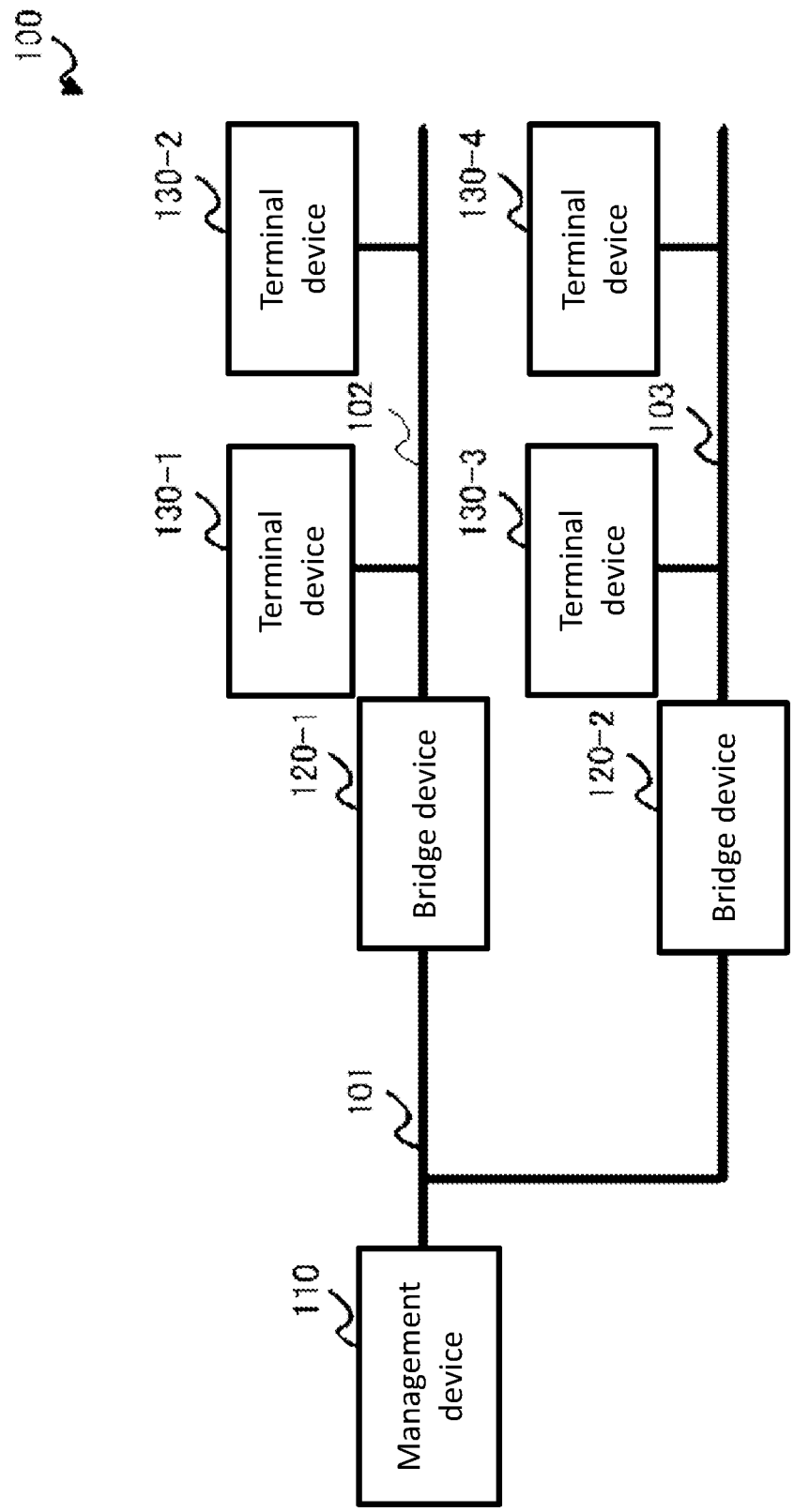
FIG. 1 is a configuration diagram showing an example of a facility network according to Embodiment 1 of the present invention.

FIG. 1 is a configuration diagram showing an example of a facility network according to Embodiment 1 of the present invention. As shown in FIG. 1, a facility network 100 includes buses 101 to 103, a management device 110, bridge devices 120-1 and 120-2, and terminal devices 130-1 to 130-4.

The buses 101 to 103 are data transmission paths connecting individual devices. The devices connected via the buses 101 to 103 can mutually send and receive data. The bus 101 is a data transmission path to link the management device 110 with the bridge devices 120-1 and 120-2; the bus 102 is a data transmission path to link the bridge device 120-1 with the terminal devices 130-1 and 130-2; and the bus 103 is a data transmission path to link the bridge device 120-2 with the terminal devices 130-3 and 130-4. The bus 101 is a first bus corresponding to an upstream bus; the buses 102 and 103 are second buses corresponding to downstream buses.

The management device 110 transmits a request frame to obtain state information of each of the terminal devices 130-1 to 130-4.

Devices that send and receive data in communication to and from other devices connected to the facility network 100 are the terminal devices 130-1 to 130-4. Each of the terminal devices 130-1 to 130-4 transmits a response frame including their own state information to the management device 110 in response to a request from the management device 110.

Each of the bridge devices 120-1 and 120-2 is a device which operates in the second layer of the Open System Interconnection (OSI) reference model, and includes a filtering database describing how the management device 110 and the terminal devices 130-1 to 130-4 are connected to the buses 101 to 103.

On the basis of the filtering database, each of the bridge devices 120-1 and 120-2 determines which of the bus 102 or the bus 103 a request frame should be transmitted through, the request frame being addressed to one among the terminal devices 130-1 to 130-4 (filtering operation). Details of the filtering operation will be described later.

Figure 2:
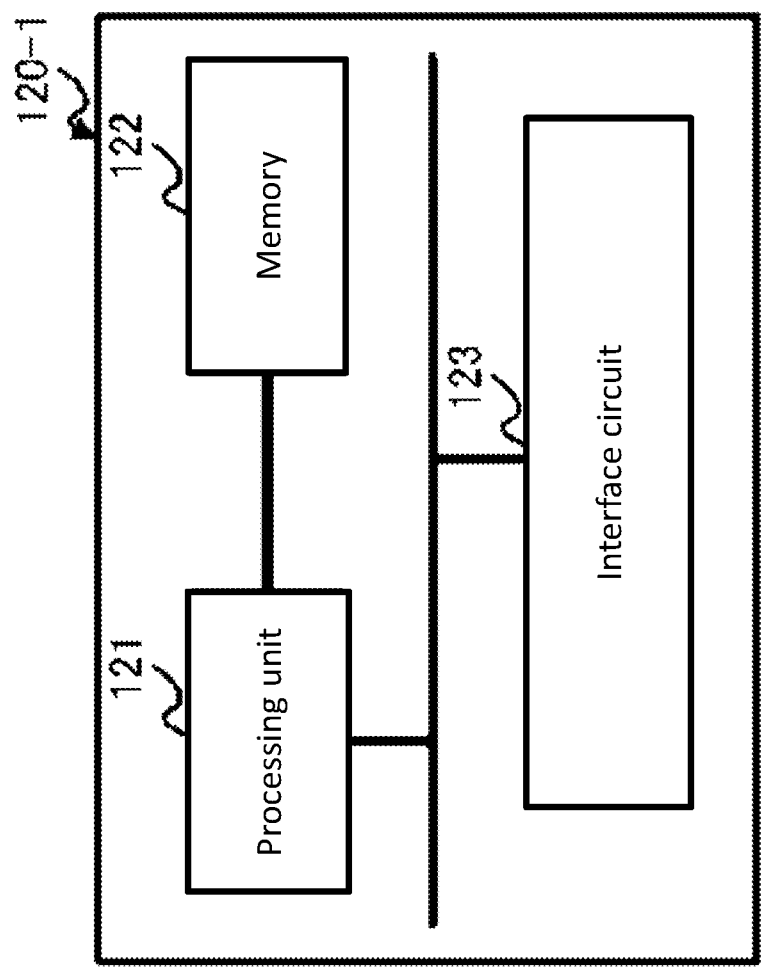
FIG. 2 shows a structure of an example of the bridge device according to Embodiment 1 of the present invention.

Next, using FIG. 2, a hardware configuration of the bridge device 120-1 will be explained. FIG. 2 shows a structure of an example of the bridge device according to Embodiment 1 of the present invention. As shown in FIG. 2, the bridge device 120-1 includes a processing unit 121 to execute processing, a memory 122 to record data, and an interface circuit 123 which is connected to buses and sends and receives information to and from outside devices. The processing unit 121 is a component such as a Central Processing Unit (CPU), a Large Scale Integration (LSI), or an Integrated Circuit (IC) to execute processing. In the following explanation, the processing unit 121 is assumed to be a CPU. The bridge device 120-2 has the same hardware configuration as the bridge device 120-1, therefore its explanation will be omitted.

Figure 3:
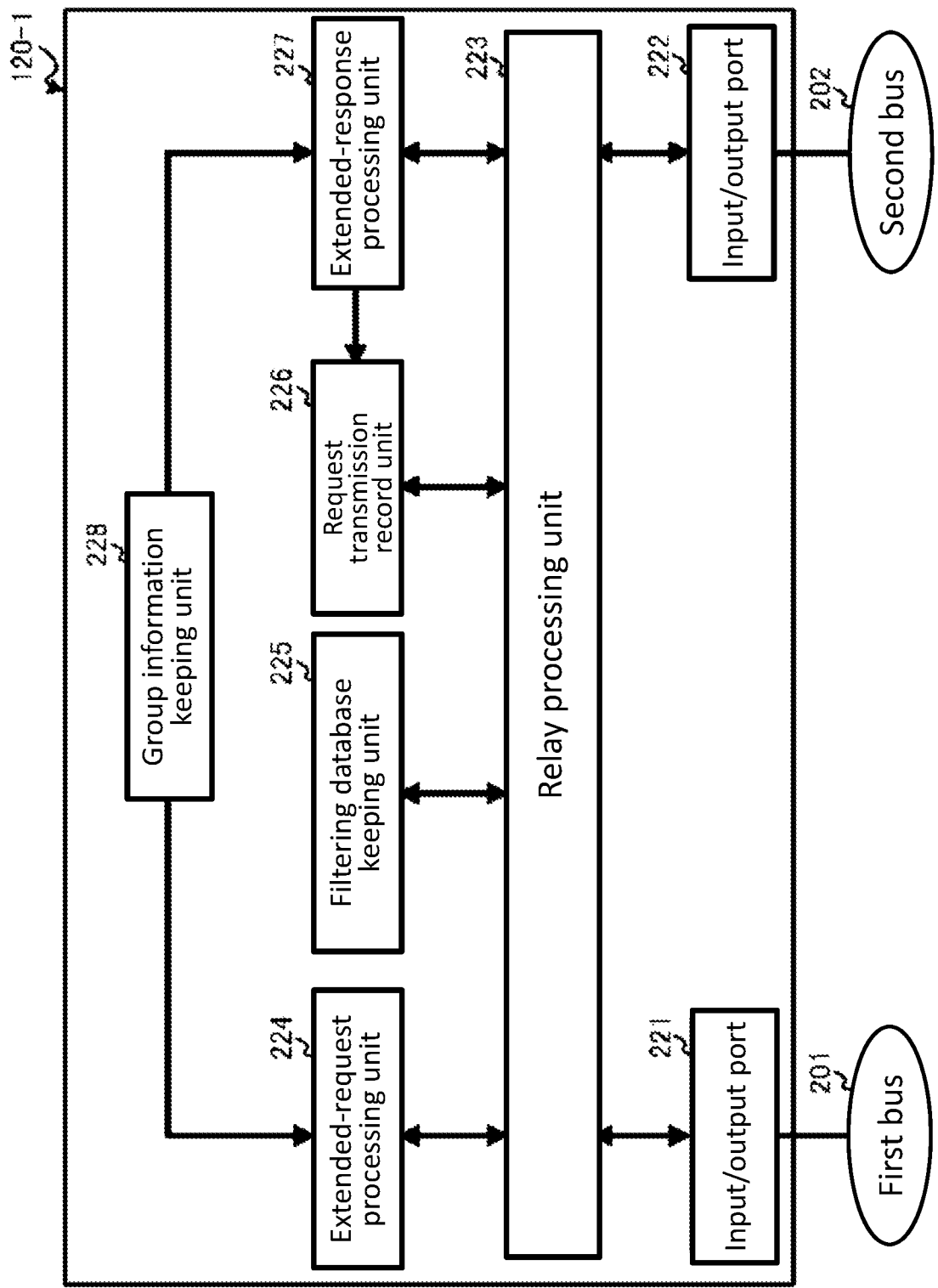
FIG. 3 shows an example of a configuration of function components of the bridge device according to Embodiment 1 of the present invention.

FIG. 3 shows an example of a configuration of function components of the bridge device according to Embodiment 1 of the present invention. In FIG. 3, the bridge device 120-1 includes: an input/output port 221 connected to a first bus 201; an input/output port 222 connected to a second bus 202; a relay processing unit 223; an extended-request processing unit 224; a filtering-database keeping unit 225; a request transmission record unit 226; an extended-response processing unit 227; and a group information keeping unit 228. Note that, in the bridge device 120-1, the first bus 201 is the bus 101 and the second bus 202 is the bus 102.

The functions of the input/output port 221 and the input/output port 222 are performed by the interface circuit 123 shown in FIG. 2. Also, the relay processing unit 223, the extended-request processing unit 224, the filtering-database keeping unit 225, the request transmission record unit 226, the extended-response processing unit 227, and the group information keeping unit 228 have functions which the processing unit 121 realizes by reading out a program recorded in the memory 122 shown in FIG. 2 and executing the program.

In FIG. 3, each of the input/output ports 221 and 222 is a port through which information is inputted from a connected bus, and through which information is outputted to the connected bus. To be more specific, the input/output port 221 is connected to the bus 101 being the first bus 201; and a request frame from the management device 110 is inputted from the bus 101 to the input/output port, and a response frame addressed to the management device 110 is outputted to the bus 101 from the input/output port. The input/output port 222 is connected to the bus 102 being the second bus 202; and response frames from the terminal devices 130-1 and 130-2 are inputted from the bus 102 to the input/output port; and request frames addressed to the terminal devices 130-1 and 130-2 are outputted to the bus 102 from the input/output port. Note that the input/output port 221 corresponds to a first input/output port and the input/output port 222 corresponds to a second input/output port.

Through the input/output ports 221 and 222, the relay processing unit 223 receives from the management device 110, a request frame as an input frame, and receives from the terminal devices 130-1 and 130-2, response frames as input frames; and then the relay processing unit relays the input frames to the extended-request processing unit 224, the filtering-database keeping unit 225, the request transmission record unit 226, and the extended-response processing unit 227. The relay processing will be described later in detail.

When an input frame is inputted from the relay processing unit 223 to the extended-request processing unit, the extended-request processing unit 224 performs extended-request processing. The extended-request processing will be described later in detail.

The filtering-database keeping unit 225 stores a filtering database in the memory 122. FIG. 4 show examples of a filtering database according to Embodiment 1 of the present invention. FIG. 4(a) is an example of a filtering database of the bridge device 120-1, which includes pairs of devices and connection ports. In the filtering database, the devices include the management device 110 and the terminal devices 130-1 to 130-4, and the connection ports include the input/output ports 221 and 222. Here, it is assumed that the filtering database is manually set. However, as described in Patent Document 1, the filtering database can be automatically set by learning from the received input frames.

Referring to FIG. 3 again, the request transmission record unit 226 follows instructions from the relay processing unit 223 to record or delete the transmission history of request frames from the management device 110.

When an input frame is inputted from the relay processing unit 223 to the extended-response processing unit, the extended-response processing unit 227 performs the extended-response processing. The extended-response processing will be described later in detail.

The group information keeping unit 228 stores group information in the memory 122. FIG. 5 is a data structure diagram showing an example of the group information according to Embodiment 1 of the present invention. As shown in FIG. 5, the group information includes names of representative terminal devices each of which represents their group and lists each of which includes terminal devices belonging to their group. In FIG. 5, the group represented by the terminal device 130-1 includes three terminal devices 130-1, 130-2 and 130-3, and the group represented by the terminal device 130-3 includes the terminal devices 130-3, 130-4 and 130-1. A representative terminal device name serves as its group identifier. The group information may be manually inputted by a user or automatically downloaded via the internet.

In the above description, the functional configuration of the bridge device 120-1 has been explained. The bridge device 120-2 has the same configuration as the bridge device 120-1 except that the second bus to which the input/output port 222 is connected is the bus 103 and that the filtering-database keeping unit 225 stores a filtering database different from that of the bridge device 120-1. FIG. 4 (b) shows an example of the filtering database of the bridge device 120-2. Here, the terminal devices 130-1 to 130-4 and the input/output ports 221 and 222 being connection ports are paired differently from the filtering database of the bridge device 120-1 shown in FIG. 4(a).

Figure 6:
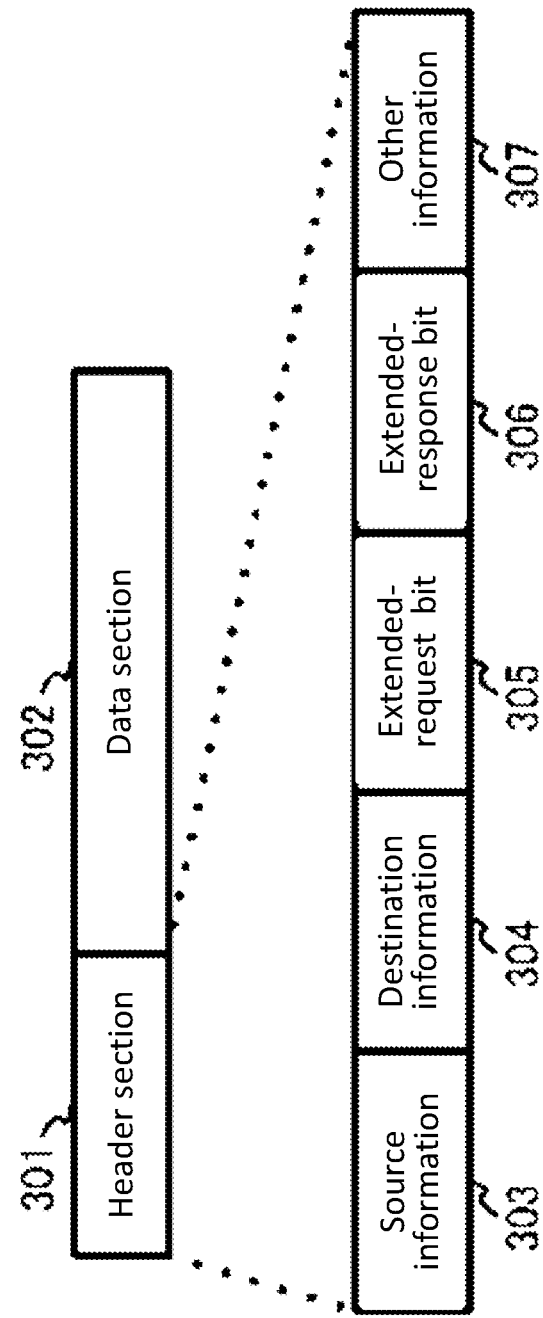
FIG. 6 is a frame structure diagram showing an example of a request frame and a response frame according to Embodiment 1 of the present invention.

Next, explanation will be made using FIG. 6, about the frame structures of the request frame from the management device 110 and the response frame from the terminal devices 130-1 to 130-4 according to Embodiment 1 of the present invention. FIG. 6 is a frame structure diagram showing an example of a request frame and a response frame according to Embodiment 1 of the present invention. As shown in FIG. 6, the request frame and the response frame have the same frame structure, and include a header section 301 necessary for transmitting and receiving information and a data section 302 including transmission data. The header section 301 includes source information 303 being data on a source, destination information 304 being data on a destination receiving data, an extended-request bit 305, an extended-response bit 306, and other information 307 being information other than the source information 303, the destination information 304, the extended-request bit 305, and the extended-response bit 306.

The extended-request bit 305 indicates whether or not its frame is an extended-request frame. And it is defined that a frame whose extended-request bit has a value of "1" is an extended-request frame, and a frame whose extended-request bit has a value of "0" is not an extended-request frame. Note here that the extended-request frame is a request frame which has the frame structure shown in FIG. 6 and whose destination information 304 is not an individual terminal device, but is a representative terminal device in the group information shown in FIG. 5.

A frame whose extended-request bit 305 has a value of "1" has been defined as an extended-request frame; however, the definition is not limited to this, and a frame whose extended-request bit 305 has a value of "0" may be defined as an extended-request frame. In this case, it is defined that a frame whose extended-request bit 305 has a value of "1" is not an extended-request frame.

When indicating that its frame is an extended-request frame, the extended-request bit is referred to as "enabled"; when indicating that its frame is not an extended-request frame, the extended-request bit is referred to as "disabled". Therefore, in Embodiment 1, an extended-request bit 305 with a value of "1" means an enabled one; and an extended-request bit 305 with a value of "0" means a disabled one.

The extended-response bit 306 indicates whether or not its frame is an extended-response frame. And it is defined that a frame whose extended-response bit 306 has a value of "1" is an extended-response frame, and a frame whose extended-response bit 306 has a value of "0" is not an extended-response frame. Note here that the extended-response frame is a response frame which has the frame structure shown in FIG. 6 and in which the source information 303 of the header section 301 is not an individual terminal device, but is a representative terminal device of the group information shown in FIG. 5. In addition, the extended-response frame includes, in the data section 302, all response frames' information as its components.

A frame whose extended-response bit 306 has a value of "1" has been defined as an extended-response frame; however, the definition is not limited to this, and a frame whose extended-response bit 306 has a value of "0" may be defined as an extended-response frame. In this case, it is defined that a frame whose extended-response bit 306 has a value of "1" is not an extended-response frame.

When indicating that its frame is an extended-response frame, the extended-response bit is referred to as "enabled"; when indicating that its frame is not an extended-response frame, the extended-response bit is referred to as "disabled". Therefore, in Embodiment 1, the extended-response bit 306 is enabled when its value is "1", and the extended-response bit 306 is disabled when its value is "0".

Figure 7:
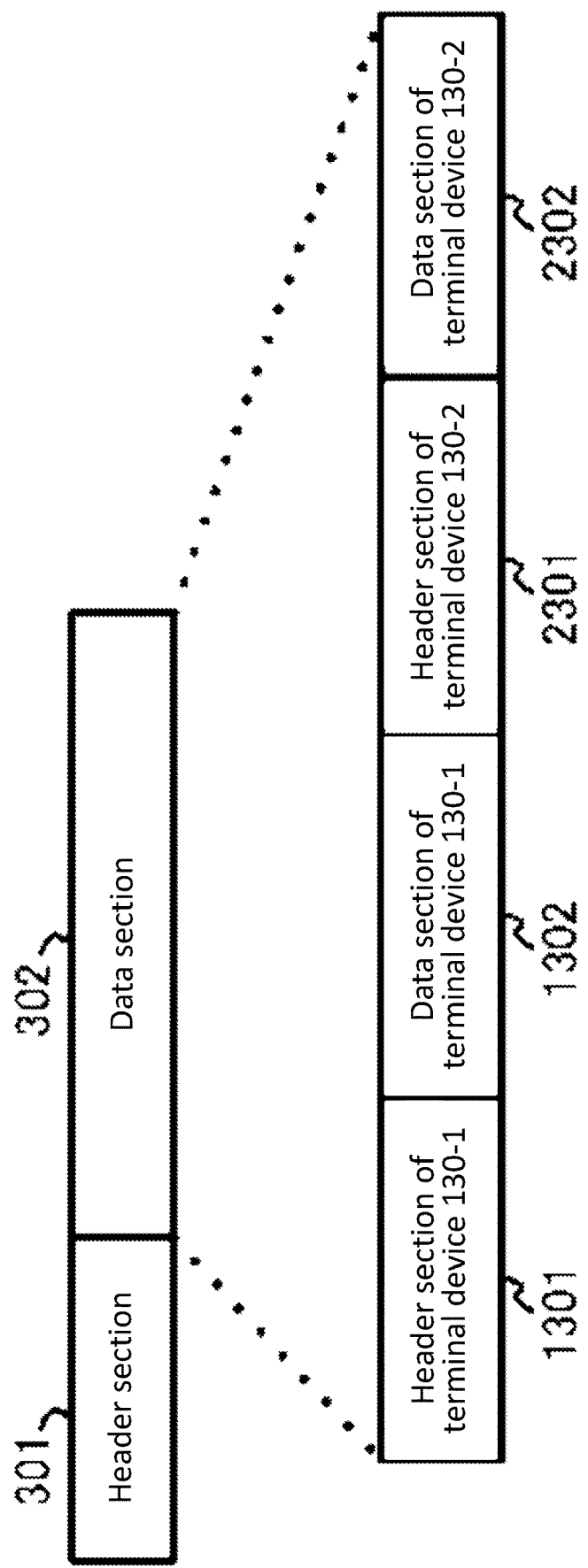
FIG. 7 is a frame structure diagram showing an example of a data section of an extended-response frame according to Embodiment 1 of the present invention.

In addition, the extended-response frame includes, in the data section 302, all response frames' information as its component. Using FIG. 7, a case will be explained in which an extended-response frame includes, as its components, information of response frames from the two terminal devices 130-1 and 130-2. FIG. 7 is a frame structure diagram showing an example of the data section 302 of the extended-response frame according to Embodiment 1 of the present invention. As shown in FIG. 7, the data section 302 of the extended-response frame includes: a header section 1301 of the terminal device 130-1 and a data section 1302 of the terminal device 130-1; and a header section 2301 of the terminal device 130-2 and a data section 2302 of the terminal device 130-2.

Next, using FIGS. 8, 9, and 10, explanation will be made about the processing flow of the bridge device 120-1. Because the processing flow the bridge device 120-2 is the same as that of the bridge device 120-1, the explanation of the processing flow of the bridge device 120-2 will be omitted.

First, explanation will be made using FIG. 8, about the flow of relay processing in the relay processing unit 223 of the bridge device 120-1. FIG. 8 is a flow chart showing an example of the relay processing flow of the relay processing unit of the bridge device according to Embodiment 1 of the present invention.

The relay processing unit 223 starts the relay processing when an input frame that is an extended-request frame, a request frame, an extended-response frame, or a response frame is inputted to the relay processing unit. Note that the extended-request frame and the response frame are inputted from the input/output ports 221 and 222, respectively; the request frame is inputted from the extended-request processing unit 224; and the extended-response frame is inputted from the extended-response processing unit 227.

Figure 8:
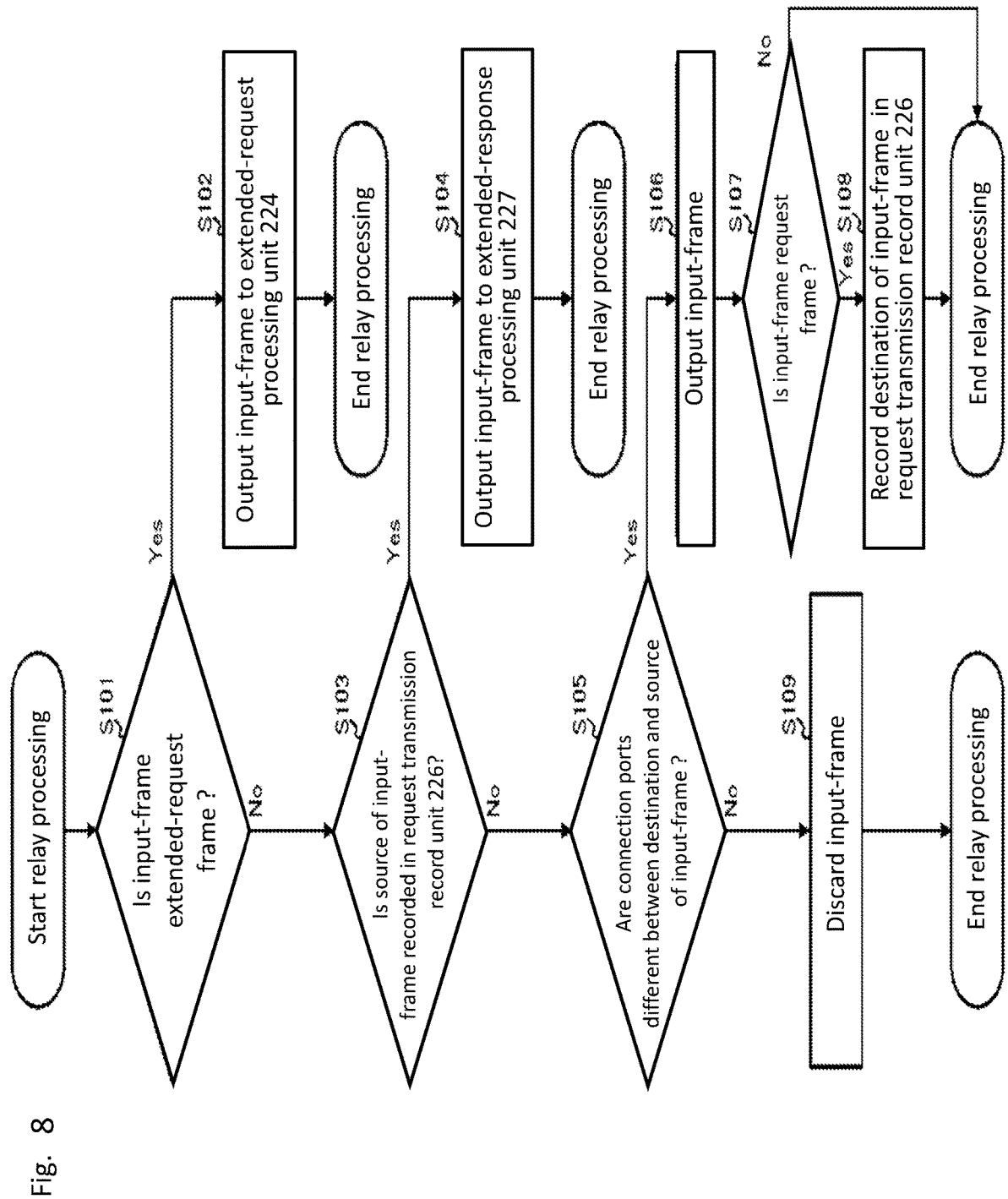
FIG. 8 is a flow chart showing an example of the relay processing flow of a relay processing unit of the bridge device according to Embodiment 1 of the present invention.

In FIG. 8, the relay processing unit 223 first determines whether an input frame inputted thereto is an extended-request frame (step S101). To be more specific, the relay processing unit 223 checks the extended-request bit of the input frame; when the value of the extended-request bit is "1", the relay processing unit determines that the input frame is an extended-request frame, to proceed to step S102.

In step S102, the relay processing unit 223 outputs the input frame to the extended-request processing unit 224. Then, the relay processing unit 223 ends the relay processing.

In step S101, when the relay processing unit 223 determines that the input frame is not an extended-request frame, in other words when the value of the extended-request bit is "0", the relay processing unit proceeds to step S103. In step S103, the relay processing unit 223 determines whether the source of the input frame is recorded in the request transmission record unit 226. To be more specific, the relay processing unit 223 compares the source information 303 of the input frame with the transmission history of the request frames recorded in the request transmission record unit 226; when finding a match therebetween, the relay processing unit determines that the source is recorded in the request transmission record unit, and then, to proceed to step S104.

In step S104, the relay processing unit 223 outputs the input frame to the extended-response processing unit 227. Then, the relay processing unit 223 ends the relay processing.

When, in step S103, the relay processing unit 223 determines that the source of the input frame is not recorded in the request transmission record unit 226, the relay processing unit proceeds to step S105. In step S105, the relay processing unit 223 determines whether the connection port for the destination of the input frame differs from the connection port for the source of the input frame. To be more specific, the relay processing unit 223 compares the destination information 304 of the input frame and the source information 303 thereof, with the filtering database shown in FIG. 4(a), to identify connection ports for the destination and source of the input frame from among the connection ports registered in the filtering database. When the identified connection ports do not match, the relay processing unit determines that the connection port for the destination differs from that for the source, to proceed to step S106.

In step S106, the relay processing unit 223 refers to the filtering database shown in FIG. 4(a) to find destination information 304 of the input frame and outputs the input frame to a connection port registered in the filtering database, to proceed to step S107.

In step S107, the relay processing unit 223 determines whether the input frame outputted in step S106 is a request frame. If it is a request frame, the relay processing unit proceeds to step S108. If it is not, the relay processing ends.

A possible way to determine that the input frame is a request frame is: a way in which the relay processing unit 223 checks the source information 303 of the input frame and determines, when the source information 303 indicates the management device 110, that the input frame is a request frame; a way in which request flag information for indicating a request frame is included in the other information 307 of the header section 301 of the input frame and the relay processing unit 223 checks the request flag information, or a way in which request flag information for indicating a request frame is included in the data section 302 of the input frame and the relay processing unit 223 checks the request flag information. In the following explanation, a case will be explained in which the relay processing unit 223 checks the source information 303 of the input frame and determines, when the source information 303 indicates the management device 110, that the input frame is a request frame.

Next, in step S108, the relay processing unit 223 records the destination of the input frame in the request transmission record unit 226. To be more specific, the relay processing unit 223 records the destination information 304 of the input frame in the request transmission record unit 226. Then, the relay processing unit 223 ends the relay processing.

When determining, in step S105, that the connection port for the destination of the input frame matches the connection port for the source thereof, the relay processing unit 223 proceeds to step S109. In step S109, the relay processing unit 223 does not output the input frame, but just discards it. Then, the relay processing unit 223 ends the relay processing.

Note here that when either or both of the destination of the input frame and the source thereof are not registered in the filtering database, the relay processing unit 223 determines in step S105 that the connection port for the destination of the input frame matches the connection port for the source thereof. Then, the relay processing unit proceeds to step S109, to discard the input frame without outputting it.

Next, using FIG. 9, explanation will be made about the flow of extended-request processing in the extended-request processing unit 224 of the bridge device 120-1. FIG. 9 is a flow chart showing an example of the extended-request processing flow of the extended-request processing unit of the bridge device according to Embodiment 1 of the present invention.

When an input frame is inputted from the relay processing unit 223 to the extended-request processing unit, the extended-request processing unit 224 starts the extended-request processing.

Figure 9:
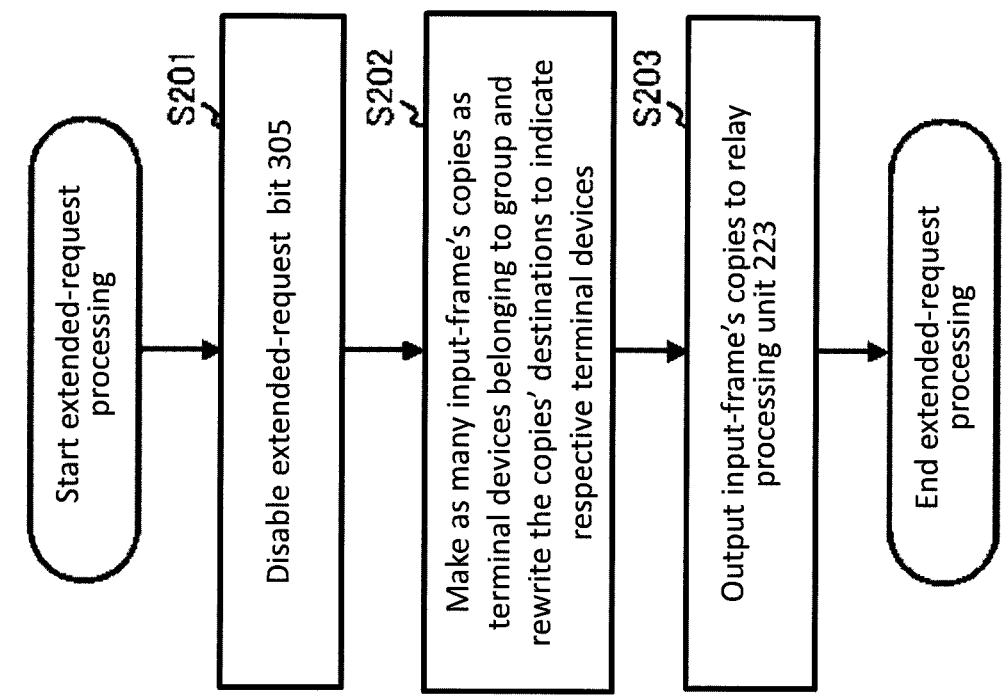
FIG. 9 is a flow chart showing an example of the extended-request processing flow of an extended-request processing unit of the bridge device according to Embodiment 1 of the present invention.

In FIG. 9, first, the extended-request processing unit 224 disables the extended-request bit 305 of the input frame inputted thereto (step S201). To be more specific, the extended-request processing unit 224 changes the extended-request bit 305 of the input frame inputted thereto to "0", to proceed to step S202. From this time on, the input frame is not regarded as an extended-request frame.

In step S202, the extended-request processing unit 224 makes as many input frame's copies as terminal devices belonging to the group and rewrites the copies' destinations so as to indicate the respective terminal devices. To be more specific, the extended-request processing unit 224 checks the destination information 304 of the input frame, to find out the group's representative terminal, and then obtains the grouped terminal devices corresponding to the representative terminal found from the group information shown in FIG. 5, which the group information keeping unit 228 stores. Then, the extended-request processing unit 224 obtains the number of terminal devices belonging to the obtained group, and makes as many input frame's copies as the terminal devices. And then, the extended-request processing unit 224 rewrites the destination information of the input frame copies to the information of the respective terminal devices, to proceed to step S203.

In step S203, the extended-request processing unit 224 outputs the rewritten input-flame-copies to the relay processing unit 223. Then, the extended-request processing unit 224 ends the extended-request processing.

Next, using FIG. 10, explanation will be made about an extended-response processing flow of the extended-response processing unit 227 of the bridge device 120-1. FIG. 10 is a flow chart showing an example of the extended-response processing flow of the extended-response processing unit of the bridge device according to Embodiment 1 of the present invention.

When an input frame is inputted from the relay processing unit 223 to the extended-response processing unit, the extended-response processing unit 227 starts the extended-response processing.

Figure 10:
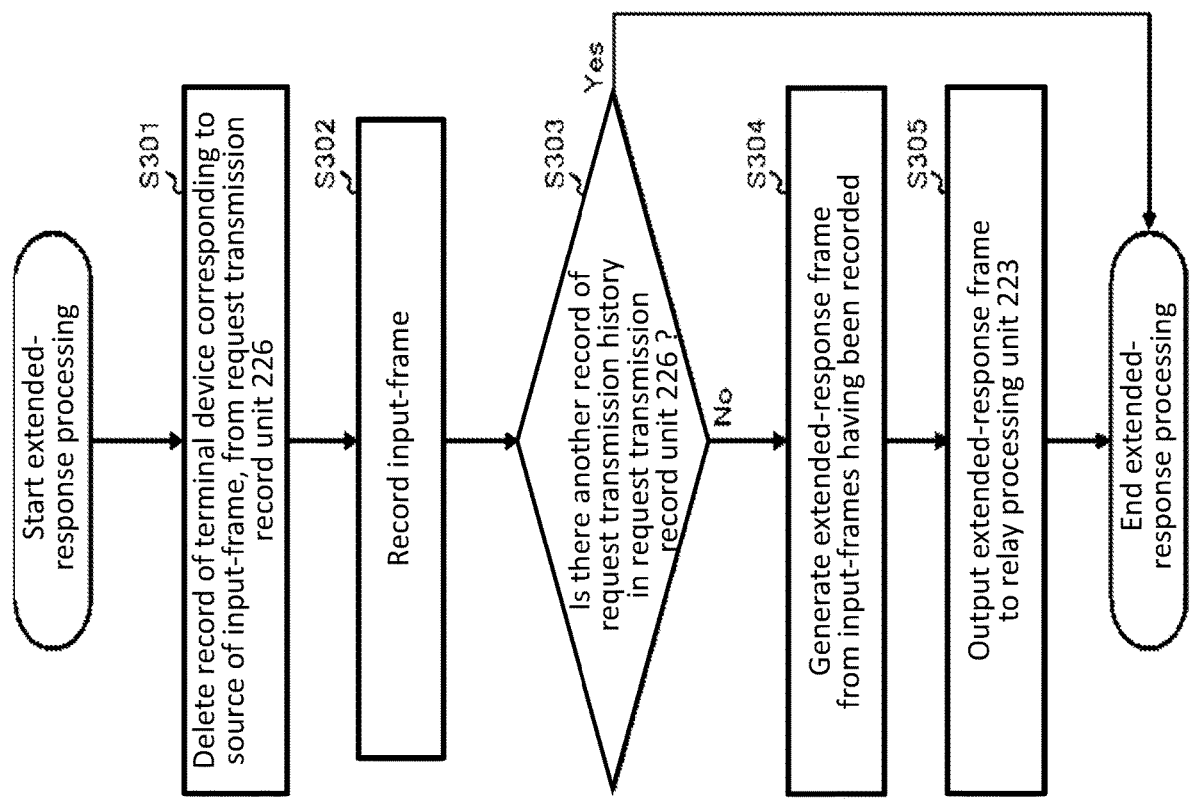
FIG. 10 is a flow chart showing an example of the extended-response processing flow of an extended-response processing unit of the bridge device according to Embodiment 1 of the present invention.

In FIG. 10, from the request transmission record unit 226, the extended-response processing unit 227 first deletes a record of the terminal device corresponding to the source of the input frame inputted thereto (step S301). To be more specific, the extended-response processing unit 227 refers the source information 303 of the input frame, to specify the terminal device corresponding to the source of the input frame, and then instructs the request transmission record unit 226 to delete the record of the specified terminal device. Then, the extended-response processing unit proceeds to step S302.

In step S302, the extended-response processing unit 227 records the input frame in the memory 122, to proceed to step S303.

In step S303, the extended-response processing unit 227 determines whether there remains another record of the request transmission history in the request transmission record unit 226. To be more specific, the extended-response processing unit 227 instructs the request transmission record unit 226 to reply to an inquiry on the presence or absence of a record in the request transmission history; and when a reply that there remains a record in the request transmission history comes back, the extended-response processing unit determines that there remains a record in the request transmission history, and then, the extended-response processing ends. When a reply that there is no record in the request transmission history comes back from the request transmission record unit 226, the extended-response processing unit 227 determines that there is no record in the request transmission history, to proceed to step S304.

In step S304, the extended-response processing unit 227 generates an extended-response frame from the input frame having been recorded in the memory 122. To be more specific, the extended-response processing unit 227 obtains the input frame having been recorded in the memory 122, and then, finds out a terminal device being the source from the source information 303 of the obtained input frame. There may be a case in which plural input frames have been recorded in the memory 122. In that case, the terminal device being the source corresponds to plural terminal devices.

Then, the extended-response processing unit 227 obtains the terminal device information of the representative terminal device of the grouped terminal devices including all terminal devices obtained as the source, from the group information stored as shown in FIG. 5 in the group information keeping unit 228. And then, the extended-response processing unit generates an extended-response frame in which the source information 303 includes the obtained representative terminal device and the extended-response bit is set to "1". Then, the extended-response processing unit proceeds to step S305.

In step S305, the extended-response processing unit 227 outputs the extended-response frame generated in step S304, to the relay processing unit 223 as its input frame. Then, the extended-response processing unit 227 ends the extended-response processing.

Next, using an example case in which an extended-request frame addressed to the terminal device 130-1 is transmitted from the management device 110, detailed explanation will be made about a series of processing flow of the bridge device 120-1, which begins with receiving an extended-request frame and ends with transmitting an extended-response frame.

First, explanation will be made about a processing flow in which an extended-request frame is received from the management device 110, request frames are generated from the received extended-request frame, and then the generated request frames are transmitted. In the header section 301 of the extended-request frame transmitted from the management device 110, the source information 303 indicates the management device 110, the destination information 304 indicates the terminal device 130-1, the extended-request bit 305 is "1", and the extended-response bit 306 is "0". In addition, it is assumed that the other information 307 includes no information. It is also assumed that the data section 302 includes information about what kind of state information is requested.

At the bridge device 120-1, the input/output port 221 receives an extended-request frame transmitted from the management device 110 via the bus 101 being a first bus, to input the received frame to the relay processing unit 223. When an extended-request frame is inputted as an input frame to the relay processing unit 223, the relay processing unit 223 starts the relay processing shown in FIG. 8.

First, the relay processing unit 223 performs step S101 shown in FIG. 8. Because the extended-request bit 305 of the extended-request frame is "1", the relay processing unit 223 determines in step S101 that the input frame is an extended-request frame, to proceed to step S102.

In step S102, the relay processing unit 223 outputs the inputted extended-request frame to the extended-request processing unit 224. Then, the relay processing unit 223 ends the relay processing.

When the extended-request frame is inputted from the relay processing unit 223 to the extended-request processing unit, the extended-request processing unit 224 starts the extended-request processing shown in FIG. 9. First, the extended-request processing unit 224 performs step S201 in FIG. 9 to set "0" to the extended-request bit 305 of the inputted extended-request frame. Next, the extended-request processing unit 224 performs step S202. The extended-request processing unit 224 obtains the terminal device information of the three terminal devices 130-1, 130-2, and 130-3 as the grouped terminal devices, from the group information shown in FIG. 5 stored in the group information keeping unit 228 and the terminal device 130-1 being the destination information 304 of the request frame. Then, the extended-request processing unit 224 makes three copies of the input frame whose extended-request bit has been set to "0", the number of the copies being equal to that of the grouped terminal devices. Then, the extended-request processing unit rewrites the copied frames' destination information 304 to the respective terminal devices 130-1, 130-2 and 130-3, to generate three request frames.

The extended-request processing unit 224 proceeds to step S203, to output the three generated request frames to the relay processing unit 223. Then, the extended-request processing unit 224 ends the extended-request processing.

When the three request frames are inputted from the extended-request processing unit 224 to the relay processing unit, the relay processing unit 223 starts the relay processing shown in FIG. 8. Here, explanation will be made about the relay processing of the relay processing unit 223 in a case where the destination information 304 indicates the terminal device 130-1 and a case where indicating the terminal device 130-3. In a case where the destination information 304 indicates the terminal device 130-2, the relay processing is the same as in the case where indicating the terminal device 130-1; therefore, the description will be omitted.

First, explanation will be made about the case where the destination information 304 indicates the terminal device 130-1. In step S101, because the extended-request bit 305 of the inputted request frame is "0", the relay processing unit 223 determines that the inputted frame is not an extended-request frame, to proceed to step S103.

In step S103, because the source information 303 of the inputted request frame is not recorded in the request transmission record unit 226, the relay processing unit 223 determines that the source of the inputted frame is not recorded in the request transmission record unit 226, to proceed to step S105.

In step S105, because the destination information 304 of the inputted request frame indicates the terminal device 130-1 and the source information 303 thereof indicates the management device 110, the relay processing unit 223 determines that the connection port for the destination of the inputted frame differs from the connection port for the source thereof since they are respectively the input/output port 222 and the input/output port 221. Then, the relay processing unit proceeds to step S106.

In step S106, the relay processing unit 223 outputs the inputted request frame to the input/output port 222 which is the connection port of the addressed terminal device 130-1. Then, the relay processing unit proceeds to step S107. As a result, the request frame is transmitted to the bus 102 being the second bus 202, and thus the request frame is transmitted to the terminal device 130-1.

In step S107, the relay processing unit 223 checks the source information 303 of the inputted frame; because the source information 303 indicates the management device 110, the relay processing unit 223 determines that the inputted frame is a request frame, to proceed to step S108.

In step S108, the relay processing unit 223 records, in the request transmission record unit 226, the terminal device 130-1 indicated by the destination information 304 of the inputted request frame. Then, the relay processing unit 223 ends the relay processing.

Next, explanation will be made about a case where the destination information 304 indicates the terminal device 130-3. In FIG. 8, determination details in step S101 and in step S103 of the relay processing unit 223 are the same as in the case in which the destination information 304 indicates the terminal device 130-1. Therefore, their explanations will be omitted from the following description.

In step S105, the relay processing unit 223 refers to the filtering database shown in FIG. 4(a) and determines that the connection port for the terminal device 130-3 being the destination of the inputted frame is the same port, i.e. the input/output port 221, as the connection port for the management device 110 being the source. Then, the relay processing unit proceeds to step S109.

In step S109, the relay processing unit 223 discards the inputted request frame whose destination information 304 indicates the terminal device 130-3. Then, the relay processing of the relay processing unit 223 ends.

As described above, the relay processing in a case of the request frame whose destination information 304 indicates the terminal device 130-2, is the same as that in a case of the request frame whose destination information 304 indicates the terminal device 130-1; therefore, the relay processing unit 223 outputs the inputted request frame to the input/output port 222 and records the terminal device 130-2 indicated by the destination information 304, in the request transmission record unit 226.

Therefore, when the management device 110 transmits a request frame for obtaining the states of the terminal devices 130-1, 130-2, and 130-3, the bridge device 120-1 transmits to each of the terminal devices 130-1 and 130-2, a request frame requesting their state.

Next, explanation will be made about a processing flow of the bridge device 120-1 in which the bridge device 120-1 receives response frames from the terminal devices 130-1 and 130-2 having received the request frames transmitted from the bridge device 120-1, and then, generates and transmits an extended-response frame.

In the header section 301 of the response frame transmitted from the terminal device 130-1, the source information 303 indicates the terminal device 130-1, the destination information 304 indicates the management device 110, the extended-request bit 305 is "0", and the extended-response bit 306 is "0". In addition, it is assumed that the other information 307 includes no information and that the data section 302 includes information about the state of the terminal device 130-1.

The response frame transmitted from the terminal device 130-2 is the same as the response frame transmitted from the terminal device 130-1 except that the source information 303 indicates the terminal device 130-2 and the data section 302 includes information on the state of the terminal device 130-2.

Here, explanation will be made about a case in which a response frame is inputted from the terminal device 130-1 to the bridge device 120-1, and then another response frame is inputted from the terminal device 130-2 to the bridge device 120-1.

In the bridge device 120-1, the input/output port 222 receives the response frame from the terminal device 130-1 and then inputs it to the relay processing unit 223. When the response frame is inputted to the relay processing unit, the relay processing unit 223 starts the relay processing shown in FIG. 8. The bridge device 120-1 performs step S101, step S103, and step S104 in this order, to output the inputted response frame to the extended-response processing unit 227, and then the bridge device ends the relay processing.

When the response frame is inputted from the relay processing unit 223 to the extended-response processing unit, the extended-response processing unit 227 starts the extended-response processing shown in FIG. 10. First, the extended-response processing unit 227 performs step S301 shown in FIG. 10, to delete the record of the terminal device 130-1 from the request transmission record unit 226.

Next, the extended-response processing unit 227 performs step S302. The extended-response processing unit 227 records the inputted response frame from the terminal device 130-1 in the memory 122, to proceed to step S303.

In step S303, the extended-response processing unit 227 refers to the request transmission record unit 226 and determines whether there remains a record of the request transmission history in the request transmission record unit 226. Here, because there remains the record of the terminal device 130-2 in the request transmission history, the extended-response processing unit 227 ends its processing.

Next, the response frame from the terminal device 130-2 is inputted to the bridge device 120-1. In a case of a response frame transmitted from the terminal device 130-2, processing details in step S101, step S103, and step S104 of the relay processing unit 223 of the bridge device 120-1 are the same as those in a case of a response frame transmitted from the terminal device 130-1, so that explanations about these steps will be omitted and explanation will be started from the processing flow of the extended-response processing unit 227.

The extended-response processing unit 227 first deletes, in step S301, the record of the terminal device 130-2 from the request transmission record unit 226 and then records, in step S302, the inputted response frame transmitted from the terminal device 130-2 in the memory 122. Here, the record of the terminal device 130-2 is deleted from the request transmission record unit 226, resulting in no records of the request history in the request transmission record unit 226.

Next, the extended-response processing unit 227 performs step S303. With no records left in the request transmission history in the request transmission record unit 226, the extended-response processing unit 227 proceeds to step S304.

In step S304, the extended-response processing unit 227 generates an extended-response frame from the two inputted response frames which were transmitted from the terminal device 130-1 and the terminal device 130-2 and then were recorded in the memory. Then, the extended-response processing unit proceeds to step S305. To be more specific, an extended-response frame is generated in which, in its header section 301, the source information 303 indicates the terminal device 130-1, the destination information 304 indicates the management device 110, the extended-request bit 305 is "0", and the extended-response bit 306 is "1". In addition, it is assumed that no information is included in the other information 307. It is also assumed, as shown in FIG. 7, that the data section 302 includes the response frame from the terminal device 130-1 and the response frame from the terminal device 130-2.

In step S305, the extended-response processing unit 227 outputs the generated extended-response frame to the relay processing unit 223. Then, the extended-response processing unit 227 ends the extended-response processing.

When an extended-response frame is inputted from the extended-response processing unit 227 to the relay processing unit, the relay processing unit 223 starts the relay processing shown in FIG. 8. Then the bridge device 120-1 performs successively step S101, step S103, step S105, and step S106.

In step S106, the relay processing unit 223 outputs the inputted extended-response frame to the input/output port 221 which is the connection port for the management device 110 corresponding to the destination of the inputted frame. Then, the process proceeds to step S107. As a result, the extended-response frame is transmitted to the management device 110.

In step S107, the relay processing unit 223 refers to the source information 303 of the inputted frame; because the source information 303 does not indicate the management device 110, the relay processing unit 223 determines that the inputted frame is not a request frame, to end its processing.

In this way, the bridge device 120-1 transmits to the management device 110, the two response frames transmitted from the terminal devices 130-1 and 130-2 as one single extended-response frame.

As described, each of the bridge devices 120-1 and 120-2 according to Embodiment 1 generates, from an extended-request frame transmitted from the management device 110, request frames addressed to terminal devices, and transmits the generated request frames to the terminal devices. This can bring an effect to reduce the waste of the band resource in the upstream bus connected to the management device.

In addition, the bridge devices 120-1 and 120-2 according to Embodiment 1 each generate an extended-response frame from response frames transmitted from the plural terminal devices, to transmit the generated extended-response frame to the management device 110. This can reduce the number of times to transmit response frames to the upstream bus connected to the management device, so that other frames such as another request frame from the management device 110 will be less likely to be sent at the same transmission timing, bringing an effect to reduce occurrence of delays in transmitting frames.

Explanation has been made about an example in which the filtering databases of the bridge devices 120-1 and 120-2 are set manually. The setting method is not limited to this, and the filtering databases may be automatically set by learning from the received frames.

Such a setting method will be explained in detail. Each of the bridge devices 120-1 and 120-2 includes a filtering database update unit. In this bridge device, a frame received by the input/output port 221 or 222 is inputted to the filtering database update unit prior to the relay processing unit 223. Then, the filtering database update unit compares the source information 303 of the inputted frame with the filtering database, to determine whether the source information 303 is registered in the filtering database.

When it is determined that the source information 303 of the inputted frame is not registered in the filtering database, the filtering database update unit relates the source information 303 with the input/output port 221 or 222 having received the inputted frame and registers the related pair in the filtering database.

When a frame with its destination information 304 being not registered in the filtering database is inputted into the bridge device 120-1 or 120-2 provided with the filtering database update unit, the relay processing unit 223 determines, in step S105 of FIG. 8, that the connection port for the destination of the inputted frame differs from the connection port for the source thereof, and then outputs the inputted frame to an input/output port that is different from an input/output port corresponding to the source information of the inputted frame.

Note here that, in the above-mentioned case where the destination information 304 of the inputted frame is not registered in the filtering database, when a response frame is not inputted from the device corresponding to the destination information 304 even after a certain period has elapsed since the inputted frame was outputted from the input/output port 221 or 222, the filtering database update unit relates the input/output port 221 or 222 from which the inputted frame was not outputted with the destination information 304, to register the related pair in the filtering database. A determination that a response frame has not been inputted from the device corresponding to the destination information 304 even after a certain period has elapsed, is made when the filtering database update unit verifies, after the certain period has elapsed, that a device corresponding to the destination information 304 has not been registered to the filtering database.

Embodiment 2

In Embodiment 1, explanation has been made about an embodiment in which the group information keeping unit 228 in each of the bridge devices 120-1 and 120-2 includes pieces of group information each of which is designated by a representative terminal device as its group identifier as shown in FIG. 5. In Embodiment 2, explanation will be made about an embodiment in which, instead of using the representative terminal devices as their group identifiers, group numbers are used. To be more specific, representative terminal devices are not used for the destination information 304 of the extended-request frame and the source information 303 of the extended-response frame, but group numbers will be used therefor. The configuration of the facility network, the configuration of the bridge devices, and the processing flow of the bridge devices are the same as shown in Embodiment 1; therefore, their explanations will be omitted.

FIG. 11 is a data structure diagram showing an example of group information according to Embodiment 2 of the present invention. As shown in FIG. 11, a piece of group information includes a group number, being a group identifier, and terminal devices belonging to the group. In FIG. 11, a group with its group number Group 1 includes three grouped terminal devices 130-1, 130-2, and 130-3; and a group with its group number Group 2 includes three grouped terminal devices 130-3, 130-4, and 130-1. The group information may be manually inputted by a user or automatically downloaded via the internet.

By using group numbers as group identifier, the number of groups can be chosen as any number; therefore, the number of groups can be made larger than that in a case where a group is identified by its representative terminal device. Therefore, terminal device grouping can be performed in more detail according to necessity. For example, terminal device grouping can be performed, not only according to the terminal device state information having been requested, but also according to conditions such as the time to transmit the request frames or the band-resource consumption amount in the upstream bus connected to the management device 110. By referring to such detailed group information, each of the bridge devices 120-1 and 120-2 according to Embodiment 2 can generate request frames for individual terminal devices from an extended-request frame defining more detailed conditions, and can generate an extended-response frame from response frames received from the respective terminal devices.

As so far described, in the bridge devices 120-1 and 120-2 according to Embodiment 2, a group number is given as a group identifier in group information; therefore, it is possible to create groups with detailed conditions since the number of the groups can be defined to be any required number, which enables the bridge device to generate request frames for terminal devices and to generate an extended-response frame on the basis of more detailed conditions.

Embodiment 3

In Embodiment 1, an embodiment has been explained in which the data section 302 of the extended-response frame generated by the bridge devices 120-1 and 120-2 includes the header sections and the data sections of all the response frames which compose the extended-response frame. In Embodiment 3, an embodiment will be explained in which the data section 302 of an extended-response frame includes aggregation data into which the data sections of the response frames are aggregated to compose the extended-response frame. The configuration of the facility network, the configuration of the bridge devices, and the processing flow of the bridge devices are the same as in Embodiment 1; therefore, their explanations will be omitted.

Figure 12:
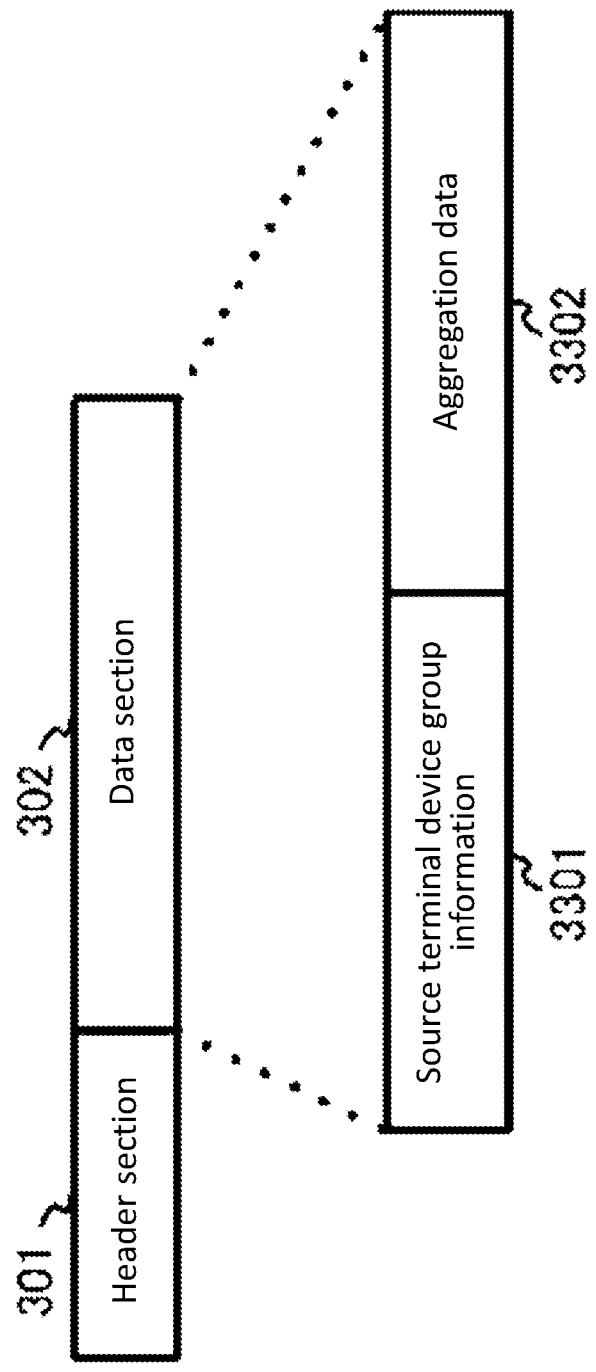
FIG. 12 is a data structure diagram showing an example of an extended-response frame according to Embodiment 3 of the present invention.

FIG. 12 is a data structure diagram showing an example of the extended-response frame according to Embodiment 3 of the present invention. FIG. 12 shows an example in which an extended-response frame is generated from response frames from two terminal devices 130-1 and 130-2. As shown in FIG. 12, the extended-response frame has, in its data section 302, source terminal device group information 3301 including the terminal devices 130-1 and 130-2 being the sources of the response frames to compose the extended-response frame, and has aggregation data 3302 into which the data sections of the response frames from the two terminal devices 130-1 and 130-2 are aggregated.

Figure 13:
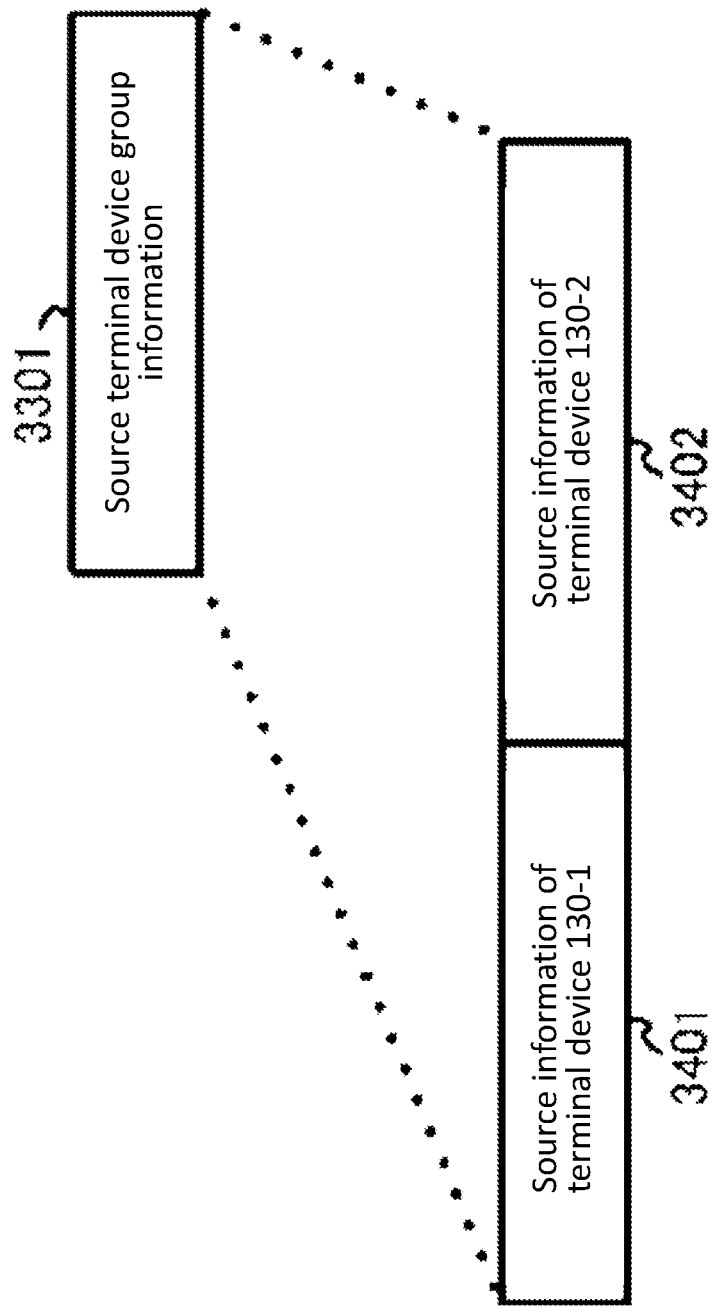
FIG. 13 is a data structure diagram showing an example of source terminal device group information according to Embodiment 3 of the present invention.

Note here that the source terminal device group information 3301 is information into which only the source information 303 of the response frames from the terminal devices 130-1 and 130-2 is aggregated. FIG. 13 is a data structure diagram showing an example of the source terminal device group information according to Embodiment 3 of the present invention. As shown in FIG. 13, the source terminal device group information 3301 includes source information 3401 of the terminal device 130-1 being the source information 303 of the terminal device 130-1, and includes source information 3402 of the terminal device 130-2 being the source information 303 of the terminal device 130-2. As described above, because the source terminal device group information 3301 consists only of the source information 3401 of the terminal device 130-1 and the source information 3402 of the terminal device 130-2, the source terminal device group information 3301 has a data size smaller than information into which the header sections 301 of the response frames from the terminal devices 130-1 and 130-2 are aggregated in Embodiment 1.

Figure 14:
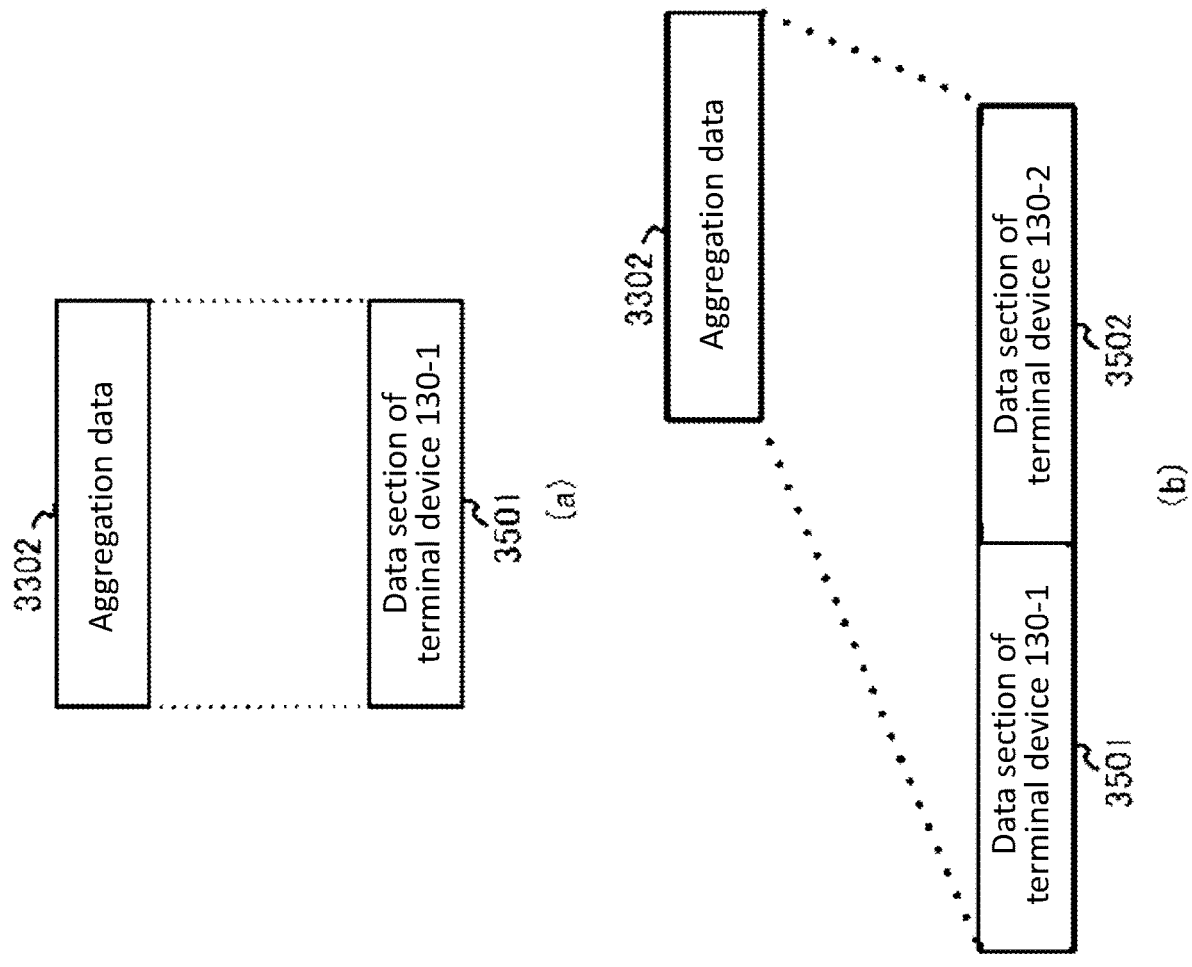
FIG. 14 are data structure diagrams each showing an example of aggregation data according to Embodiment 3 of the present invention.

The aggregation data 3302 is information into which only the data sections 302 of the response frames from the terminal devices 130-1 and 130-2 are aggregated. FIG. 14 are data structure diagrams each showing an example of aggregation data according to Embodiment 3 of the present invention. FIG. 14(a) shows the aggregation data 3302 in a case where the states of the terminal device 130-1 and the terminal device 130-2 whose state information is requested by the request frames, are the same. FIG. 14(b) shows the aggregation data 3302 in a case where the states of the terminal device 130-1 and the terminal device 130-2 whose state information is requested by the request frames, are different.

In FIG. 14(a), the aggregation data 3302 consists of only the data section 3501 of the terminal device 130-1, which is the data section 302 of the response frame from the terminal device 130-1. This is because when the states of the terminal device 130-1 and the terminal device 130-2 whose state information is requested by the request frames are the same, information of the data section 302 of the response frames from the terminal devices 130-1 and 130-2 becomes the same. In FIG. 14(a), an example has been explained in which the aggregation data 3302 consists of only the data section 302 of the response frame from the terminal device 130-1; examples are not limited to this, and the aggregation data 3302 may consist of only the data section 302 of the response frame from the terminal device 130-2.

As shown in FIG. 14 (b), the aggregation data 3302 includes the data section 3501 of the terminal device 130-1 being the data section 302 of the response frame from the terminal device 130-1, and includes the data section 3502 of the terminal device 130-2 being the data section 302 of the response frame sent from the terminal device 130-2. This is because, in a case where the states of the terminal device 130-1 and the terminal device 130-2 whose state information is requested by the request frames are different, pieces of information of the data sections 302 of the response frames from the terminal devices 130-1 and 130-2 are different, thus both pieces of information become necessary.

As described so far, each of the bridge devices 120-1 and 120-2 according to Embodiment 3 generates an extended-response frame including, in its data section 302, an aggregation data 3302 into which pieces of information of the data sections 302 of the response frames inputted from individual terminal devices are aggregated. Therefore, when the states of the terminal devices are the same, the data size of the extended-response frame can be reduced in comparison to the case in which the data section 302 includes all response frames from the respective terminal devices.

Here, an example has been explained in which an extended-response frame is generated from response frames from two terminal devices. However, the number of terminal devices is not limited to this, and the extended-response frame may be generated from the response frames from three or more terminal devices. In this case, even when not all terminal devices are in the same state, each of the bridge devices 120-1 and 120-2 generates source terminal device group information 3301 and aggregation data 3302 for each group of terminal devices in the same state. Thus, the data size of an extended-response frame to be generated can be reduced.

As described above, each the bridge devices 120-1 and 120-2 according to Embodiment 3 generates the extended-response frame including, in its data section 302, the aggregation data 3302 into which pieces of information of the data sections 302 of the response frames inputted from respective terminal devices are aggregated. This can reduce the data size of the extended-response frame to be generated, bringing an effect to reduce the waste of the band resource width in the upstream bus connected to the management device.

| Description of Symbols | | |
|---|---|---|
| 100: facility network | 101, 102, 103: bus | 110: management device |
| 120-1, 120-2: bridge device | 121: processing unit | 122: memory |
| 123: interface circuit | 201: first bus | 202: second bus |
| 221, 222: input/output port | 223: relay processing unit | |
| 224: extended-request processing unit | 225: filtering-database keeping unit | |
| 226: request transmission record unit | 227: extended-response processing unit | |
| 228: group information keeping unit | | |

The invention claimed is:

1. A bridge device, comprising:
 a first input/output port;
 a second input/output port;
 a processor to execute a program; and
 a memory to store the program which, when executed by the processor, performs processes of,
  keeping a group identifier and a correspondence between one or more terminal devices and the group identifier, the group identifier identifying a group that includes one or more terminal devices to be connected to the second input/output port, the one or more terminal devices belonging to the group;
  generating, when an extended-request frame including destination information corresponding to the group identifier for requesting state information of the one or more terminal devices belonging to the group is inputted to the first input/output port, a request frame to be outputted from the second input/output port to each of the one or more terminal devices belonging to the group, on the basis of the extended-request frame; and
  outputting the request frame to the second input/output port and outputting the extended-request frame to the process of generating the request frame.

2. The bridge device according to claim 1, wherein the program further performs a process of generating an extended-response frame including source information corresponding to the group identifier from one or more response frames including state information of the one or more terminal devices belonging to the group,
 and wherein the program further performs, in the process of outputting, a process of outputting the extended-response frame to the first input/output port.

3. The bridge device according to claim 2, wherein the program further performs a process of recording transmission history of the request frame,
 and wherein the extended-response frame includes state information received from all of the one or more terminal devices having been recorded by the process of recording transmission history.

4. The bridge device according to claim 1, wherein the group identifier is information corresponding to a representative terminal device of the group.

5. The bridge device according to claim 2, wherein the group identifier is information corresponding to a representative terminal device of the group.

6. The bridge device according to claim 3, wherein the group identifier is information corresponding to a representative terminal device of the group.

7. The bridge device according to claim 1, wherein the group identifier is a group number.

8. The bridge device according to claim 2, wherein the group identifier is a group number.

9. The bridge device according to claim 3, wherein the group identifier is a group number.

10. The bridge device according to claim 2, wherein the extended-response frame includes a header section and a data section, the data section including aggregation data into which the state information of the one or more terminal devices belonging to the group is aggregated.

11. The bridge device according to claim 3, wherein the extended-response frame includes a header section and a data section, the data section including aggregation data into which the state information of the one or more terminal devices belonging to the group is aggregated.

12. A facility network comprising:
 the bridge device according to claim 1;
 a management device to transmit the extended-request frame; and
 the one or more terminal devices constituting the group.

13. The facility network according to claim 12,
 wherein the program of the bridge device further performs a process of generating an extended-response frame including source information corresponding to the group identifier from one or more response frames including state information of the one or more terminal devices belonging to the group,
 and wherein the program further performs, in the process of outputting, a process of outputting the extended-response frame to the first input/output port.

14. The facility network according to claim 13,
 wherein the program of the bridge device further performs a process of recording transmission history of the request frame, and wherein the extended-response frame includes state information received from all of the one or more terminal devices having been recorded by the process of recording transmission history.

* * * * *